United States Patent [19]

Raper

[11] Patent Number: 5,199,039
[45] Date of Patent: Mar. 30, 1993

[54] LASER DIODE SUPPLY CIRCUIT

[75] Inventor: Keith Raper, Aldershot, Great Britain

[73] Assignee: Imatronic Limited, Berkshire, England

[21] Appl. No.: 721,606

[22] PCT Filed: Jul. 20, 1990

[86] PCT No.: PCT/GB90/01119
§ 371 Date: Jul. 22, 1991
§ 102(e) Date: Jul. 22, 1991

[87] PCT Pub. No.: WO91/04595
PCT Pub. Date: Apr. 4, 1991

[30] Foreign Application Priority Data

Sep. 22, 1989 [GB] United Kingdom ............... 8921483

[51] Int. Cl.$^5$ ............................................. H01S 3/00
[52] U.S. Cl. ............................................. 372/38
[58] Field of Search ....................... 372/29, 26, 32, 38

[56] References Cited

U.S. PATENT DOCUMENTS 3,898,583  8/1975  Shuey et al. ...................... 372/38
4,109,217  8/1978  Brackett et al. ................... 372/38
4,594,717  6/1986  Bracht et al. ..................... 372/38
4,674,093  6/1987  Angerstein et al. ................ 372/38
4,709,370  11/1987 Bednarz et al. .................... 372/29

FOREIGN PATENT DOCUMENTS 1483849   8/1977  Japan .
57-2587A  1/1982  Japan .
225676A   12/1983 Japan .

Primary Examiner—Léon Scott, Jr.
Attorney, Agent, or Firm—Birch, Stewart, Kolasch & Birch

[57] ABSTRACT

A voltage source is connected to a laser diode via a supply circuit and a control circuit serving to control current through the laser diode. The control circuit includes a transistor which is switched into conduction on the application of a threshold valued voltage. A light sensitive diode is optically coupled to the laser diode and is adapted to apply a control voltage to the transistor switch which is related to the optical power output of the laser diode, such that when the control voltage exceeds a predetermined threshold value, the transistor is rendered conductive to control current through the laser diode.

3 Claims, 1 Drawing Sheet

LASER DIODE SUPPLY CIRCUIT

BACKGROUND OF THE INVENTION

This invention relates to a supply circuit for a laser diode and is particularly concerned with such a circuit in which the optical power output of the laser diode may be stabilised.

Laser diodes are available at wavelengths over a broad range both in the visible and non-visible portion of the electromagnetic spectrum. For convenience, terms such as "light" are used herein to describe the invention, but the invention should not be regarded as restricted to the visible portion of the spectrum.

SUMMARY

It is an object of the present invention to provide an improved laser diode supply circuit which is capable of stabilising the optical power output of the diode notwithstanding small variations in, for example, the supply voltage or temperature.

Accordingly, the present invention consists, in one aspect, in a laser diode supply circuit comprising a laser diode connected with a voltage source and with control means serving to control current through the laser diode, wherein said control means comprises semiconductor switch means switched into conduction on the application of a threshold voltage value thereto and wherein light sensing means are provided optically coupled with the laser diode and adapted to apply to said semiconductor switch means a control voltage related to the optical power output of the laser diode, such that as said control voltage passes said threshold voltage value, the semiconductor switch means is switched into conduction to control current through the laser diode.

The semiconductor switch means may take the form of a junction or other transistor. The threshold voltage value—for example Vbe—therefore serves in this invention as a reference against which the control voltage is compared. The control voltage may be provided by a laser diode connected in series with a variable resistor, this variable resistor enabling presetting of the controlled optical power output of the laser diode. By making use of Vbe, or another semiconductor switch means threshold voltage value, this invention ingeniously avoids the need for a separate reference voltage. The effects of variation in supply voltage or temperature of the laser diode are largely nulled.

BRIEF DESCRIPTION OF THE DRAWINGS

The invention will now be described by way of example with reference to the accompanying drawings in which.

DETAILED DESCRIPTION OF THE INVENTION

Figure 1:
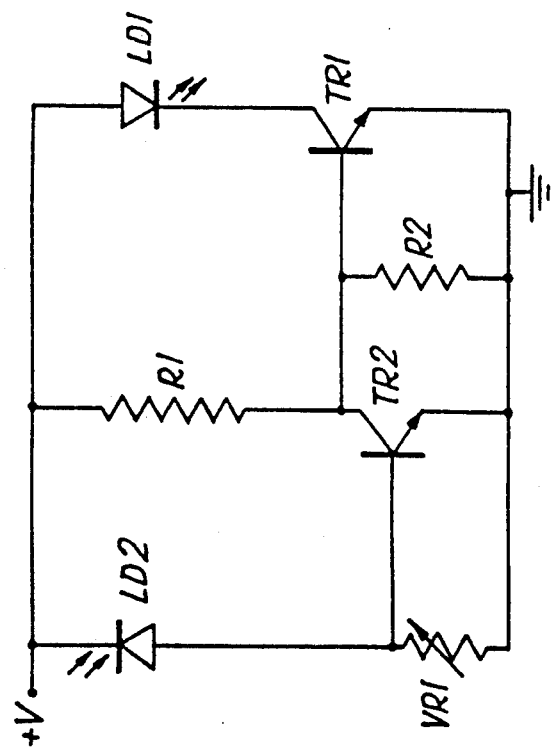
FIG. 1 is a simplified circuit diagram illustrating the present invention.

Referring initially to FIG. 1, a laser diode LD1 is connected in series with a junction transistor TR1 between a voltage source +V and ground. The base of transistor TR1 is connected to the common point of resistor R1 and a second transistor TR2, these being connected in series between the supply voltage and ground. The base of TR1 is further connected to ground through resistor R2. The base of TR2 is connected to the common point of a photo-diode LD2 and variable resistor VR2, these components again being connected in series between the supply voltage and ground.

The photo-diode LD2 is optically coupled with the laser diode LD1 to provide a reverse current which is proportional to the optical power output of the laser diode.

In operation, the current in laser diode LD1 is controlled by transistor TR1, the operating point of which is determined by resistors R1 and R2. The value of variable resistor VR1 is set so that the voltage applied to the base of transistor TR2 is beneath the voltage threshold determined by the base-emitter voltage. In the circumstance where the optical power output of the laser diode begins to exceed the desired value, the reverse current through photo-diode LD2 increases so increasing in turn, the voltage at the base of transistor TR2. This transistor is switched into conduction with the effect that current is diverted from the base of transistor TR2. This in turn reduces the collector current of transistor TR2 so stabilising the current in the laser-diode LD1.

In addition to the stabilisation described above, the optical power output of the laser diode can be modulated using a variety of techniques. Thus, for example, the supply voltage +V could be pulsed; separate means could be provided for modulating the base current of transistor TR1; or, current could be directly injected at the collector of TR1.

It will be understood that the photo-diode LD2 and variable resistor VR1 could be replaced by other means—such as an appropriately biased phototransistor or resistance network including a light sensitive resistor—for providing a control voltage related to the optical power output of the laser diode. It will further be understood by the skilled practitioner that the transistors TR1 and TR2 need not be junction transistors and that FET's or a wide range of further semiconductor control devices could be employed with modifications to the circuitry that would be obvious to the skilled man.

A further embodiment of the present invention will now be described in more detail with reference to FIG. 2.

A laser diode LD1 (NDL 3200) is provided in a common cathode arrangement with a photo-diode LD2. The laser diode LD1 is connected between the voltage buss Vcc and the collector of a junction transistor TR1 having its emitter connected to ground. A diode D1 and a capacitor C1 are both connected in parallel with the laser diode, the diode D1 serving to prevent reverse bias damage and the capacitor C1 serving to prevent damage from power surges.

The photo-diode LD2 is connected between the voltage buss Vcc and the base of junction transistor TR2. This transistor is connected between the base of transistor TR1 (through buss 10) and ground. Resistors R1 and R2 are connected in series between the voltage buss Vcc and the buss 10; resistor R3 is connected between the buss 10 and ground. Capacitor C4 is similarly connected between the buss 10 and ground and serves to restrict the turn-on rate of transistor TR1 and also ensures stability. The turn-off rate is determined by the value of resistor R3 which discharges capacitor C4. The common point of resistors R1 and R2 is connected to ground through Zener diode ZD1 which limits the drive should the supply voltage increase beyond a limit The operation of the circuit, as so far described, is analogous with that of FIG. 1. The optical power output of the laser diode LD1 is detected by the photo-diode LD2 and a reverse current, which is proportional to the optical power output of the laser diode, develops a voltage across the variable resistor VR1. Pre-setting of the variable resistor provides compensation for variations in sensitivity of photo-diodes. With increasing power output from the laser diode, the voltage across variable resistor VR1 rises in proportion to the photo-diode reverse current until a voltage threshold is reached which is set by the base-emitter voltage of transistor TR2. As the voltage across variable VR1 increases further, current is fed into the base of transistor TR2 allowing its collector-emitter to turn on and divert current from resistor R1 and R2 which would otherwise drive the base of transistor TR1. This in turn reduces the collector current of transistor TR2 stabilising the current in the laser diode. Variations in supply voltage or temperature of the laser diode have no effect on the control of the transistor TR2.

Figure 2:
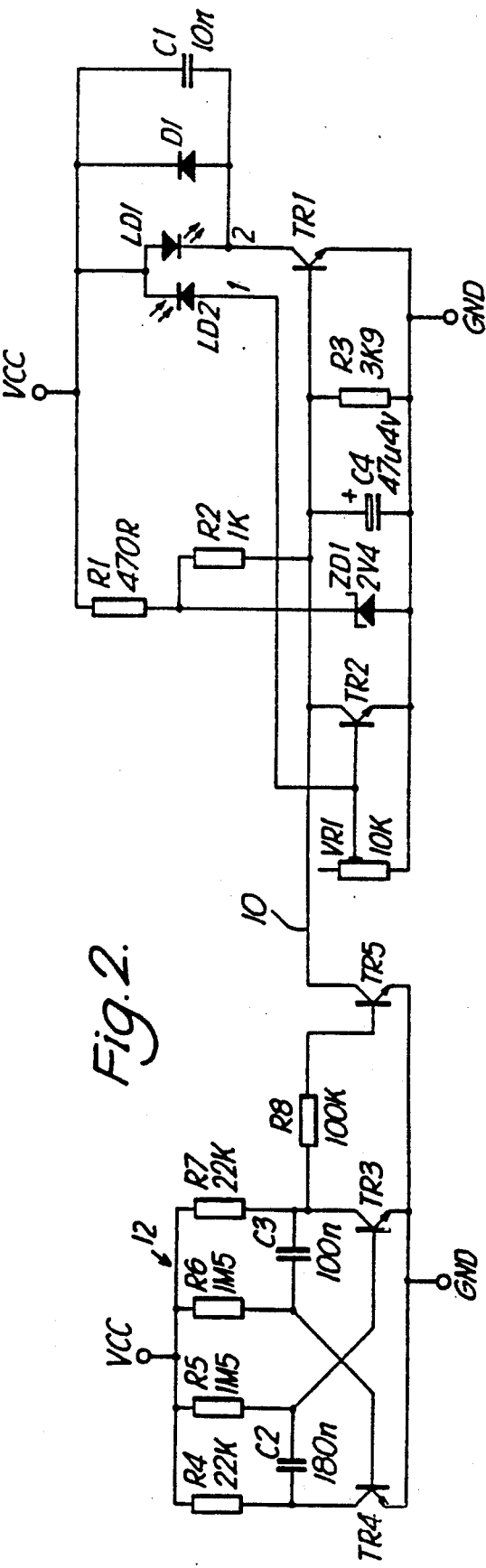
FIG. 2 is a detailed circuit diagram of one embodiment of the present invention

Returning to a detailed consideration of FIG. 2, a multivibrator is provided, as shown generally at 12, comprising transistors TR3 and TR4, capacitors C2 and C3, and resistors R4 to R7. The circuit of the multivibrator is of conventional form and detailed description is felt unnecessary. An output of the multivibrator is taken through a resistor R8 to the base of a transistor TR5 connected between the buss 10 and ground. It will be understood that the effect of the multivibrator 12 is to pulse conduction of the transistor TR1 thus providing modulation of the laser diode output to a level determined by the parameters of the multivibrator circuit 12, resistor R8 and transistor TR5.

It should be understood that still further modifications beyond those specifically described herein can be made without departing from the scope of the invention as set forth in the appended claims.

I claim:

1. A laser diode supply circuit, comprising:

first and second voltage busses;

a laser diode, having an optical power output related to current flow therethrough, connected in a first series circuit path with collector and emitter terminals of a first transistor between said first and second voltage busses, there being substantially no resistance in said first series path between the first and second voltage busses;

a second transistor having collector and emitter terminals connected in a second series path with a collector load resistance between the first and second voltage busses;

means coupling said second series path with a base terminal of said first transistor;

a light sensitive device optically coupled with said laser diode and electrically connected with a resistance in a third series path between the first and second voltage busses; and means coupling said third series path with a base terminal of said second transistor such that in operation a control voltage is applied to said base terminal which is a proportional part of the voltage difference between said first and second voltage busses, said proportional part being determined by the optical power output of said laser diode; and wherein said second transistor is switched into conduction when control voltage exceeds an intrinsic threshold voltage value of said second transistor means to provide a feedback control of the current in said first series path and thereby to stabilize the optical power of said laser diode against a variation in voltage difference between said first and second voltage busses.

2. A supply circuit according to claim 1, wherein said light sensitive device comprises a photo-diode.

3. A supply circuit according to claim 1 wherein said resistance in said third series path comprises a variable resistance.

* * * * *